(12) United States Patent
Gaide et al.

(10) Patent No.: US 10,871,796 B1
(45) Date of Patent: Dec. 22, 2020

(54) GLOBAL CLOCK AND A LEAF CLOCK DIVIDER

(71) Applicant: Xilinx, Inc., San Jose, CA (US)

(72) Inventors: Brian C. Gaide, Erie, CO (US); Chiao K. Hwang, Bakersfield, CA (US); Guoqing Ning, San Jose, CA (US); Richard W. Swanson, San Jose, CA (US); Wayne E. Wennekamp, Santa Cruz, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/533,324

(22) Filed: Aug. 6, 2019

(51) Int. Cl.
| | | |
|---|---|---|
| *G06F 1/10* | (2006.01) |
| *G06F 1/06* | (2006.01) |
| *H03L 7/08* | (2006.01) |
| *H03K 21/08* | (2006.01) |
| *H03K 19/177* | (2020.01) |

(52) U.S. Cl.
CPC .............. *G06F 1/10* (2013.01); *H03K 19/177* (2013.01); *H03K 21/08* (2013.01); *H03L 7/08* (2013.01); *G06F 1/06* (2013.01)

(58) Field of Classification Search
CPC ........... G06F 1/10; G06F 1/06; H03K 19/177; H03K 21/08; H03L 7/08
See application file for complete search history.

(56) References Cited

U.S. PATENT DOCUMENTS

| | | | |
|---|---|---|---|
| 6,445,228 B1 | 9/2002 | Nguyen | |
| 6,496,045 B1 | 12/2002 | Nguyen | |
| 6,566,918 B1 | 5/2003 | Nguyen | |
| 6,614,862 B1 * | 9/2003 | Doblar | G06F 1/06 375/354 |
| 6,667,645 B1 * | 12/2003 | Fletcher | G06F 1/10 327/200 |
| 6,744,289 B2 | 6/2004 | Nguyen et al. | |
| 7,065,170 B2 * | 6/2006 | Doblar | G06F 1/06 375/354 |
| 7,139,361 B1 | 11/2006 | Nguyen | |
| 7,142,008 B1 | 11/2006 | Sanders | |
| 7,317,342 B2 * | 1/2008 | Saint-Laurent | G06F 1/10 327/295 |
| 7,725,754 B1 | 5/2010 | Stadler | |
| 8,595,683 B1 * | 11/2013 | de Buren | G06F 17/5054 326/37 |
| 8,736,325 B1 * | 5/2014 | Savoj | H03L 7/1974 327/147 |

\* cited by examiner

*Primary Examiner* — Dinh T Le

(74) *Attorney, Agent, or Firm* — Patterson + Sheridan, LLP

(57) ABSTRACT

In some examples, a system includes a clock source, a clock distribution network, and a plurality of clock generators. The clock source is configured to generate a global clocking signal. The clock distribution network is configured to fan out the global clocking signal to a plurality of loads. The plurality of clock generators is configured to receive the global clocking signal through the clock distribution network. Each clock generator of the plurality of clock generators is configured to generate a related clocking signal to the global clocking signal from the received global clocking signal. Each clock generator of the plurality of clock generators maybe configured to supply the global clocking signal or the related clocking signal to its respective load of the plurality of loads.

20 Claims, 9 Drawing Sheets

GLOBAL CLOCK AND A LEAF CLOCK DIVIDER

TECHNICAL FIELD

Examples of the present disclosure generally relate to leaf clock divider to generate low skew related clocks.

BACKGROUND

Many applications use two or more clocking signals from a common clock source. Typically, these two or more clocking signals are distributed throughout the chip to clock various loads. Use of the two or more clocking signals is even more challenging in applications that are programmable, such that the requirement for the two or more clocking signals are not known in advance but are rather programmed at a later time.

In general, the common clock source is far away from the loads that they are distributed to. Unfortunately, using the two or more clocking signals requires much more power than using just one clocking signal. Furthermore, routing the two or more clocking signals throughout the chip is subject to process, voltage, and temperature (PVT) variations, thereby resulting in clock skew between the two or more clocking signals. Moreover, clock jitter is also high between the two or more clocking signals.

SUMMARY

Examples described herein relate to fanning out one clocking signal throughout the chip and generating a related clocking signal at a leaf node, where needed. As such, less power is required to fan out the clocking signal throughout the chip because only one clocking signal is distributed throughout the chip. Moreover, the skew between the clocking signal and the related clocking signal is reduced because the related clocking signal is generated at the leaf node, thus subject to the same PVT variations as the one clocking signal at the leaf node. Also, since only one clocking signal is fanned out to the entire chip and the related clocking signal is generated at the leaf node, the jitter between the clocking signal and the related clocking signal being generated at the leaf node is substantially the same as one another.

A non-limiting example device includes a clock source, a clock distribution network, a plurality of clock generators, and a plurality of loads. The clock source is configured to generate a global clocking signal. The clock distribution network is configured to fan out the global clocking signal to the plurality of loads. The plurality of clock generators is configured to receive the global clocking signal through the clock distribution network. A clock generator of the plurality of clock generators is configured to generate a related clocking signal to the global clocking signal from the received global clocking signal. The clock generator of the plurality of clock generators is configured to supply the global clocking signal or the related clocking signal to its respective load of the plurality of loads. The plurality of loads is configured to receive either the global clocking signal or a related clocking signal generated from its respective clock generator. The clock generator of the plurality of clock generators is positioned closer in proximity to its respective load of the plurality of loads in comparison to the clock source.

In one non-limiting example, the clock source is a phase locked loop (PLL). It is appreciated that in one example, the clock distribution network, the plurality of clock generators, and the plurality of loads are positioned within a fabric of a field programmable gate array (FPGA).

In one non-limiting example, the clock generator of the plurality of clock generators includes a clock divider configured to change a frequency of the global clocking signal to generate the related clocking signal. The clock generator of the plurality of clock generators may further include a mux configured to select between the global clocking signal and the related clocking signal. The clock generator of the plurality of clock generators may further include another mux configured to select the global clocking signal from a plurality of clocking signals. In one example, a signal controlling the mux to select between the global clocking signal and the related clocking signal is user selectable.

The related clocking signal associated with the clock generator of the plurality of clock generators has a frequency that is different from a frequency of another related clocking signal associate with another clock generator of the plurality of clock generators. In some examples, each clock generator of the plurality of clock generators includes a clock divider. Each clock divider receives asynchronous global reset configured to reset the each clock divider when global clocking signal is asserted low. The asynchronous global reset is deasserted after a number of cycles and the global clocking signal is synchronously asserted high subsequent to the asynchronous global reset being deasserted.

In some non-limiting examples, another clock generator is configured to receive the related clocking signal or the global clocking signal from the clock generator of the plurality of clock generators. The another clock generator is further configured to generate another related clocking signal that is related to the received signal. The another clock generator is further configured to select between the received signal and the another related clocking signal and further configured to supply the selection to its respective load of the plurality of loads.

In some non-limiting examples, a number of loads in the plurality of loads is greater than a number of clock generators of the plurality of clock generators.

In some non-limiting examples, a system includes a clock source, a clock distribution network, and a plurality of clock generators. The clock source is configured to generate a global clocking signal. The clock distribution network is configured to fan out the global clocking signal to a plurality of loads. The plurality of clock generators is configured to receive the global clocking signal through the clock distribution network. Each clock generator of the plurality of clock generators is configured to generate a related clocking signal to the global clocking signal from the received global clocking signal. Each clock generator of the plurality of clock generators maybe configured to supply the global clocking signal or the related clocking signal to its respective load of the plurality of loads. It is appreciated that the clock source may be a PLL. It is appreciated that in some examples, the clock distribution network and the plurality of clock generators are positioned within a fabric of an FPGA.

In some non-limiting examples, a clock generator of the plurality of clock generators comprises a clock divider configured to change a frequency of the global clocking signal to generate the related clocking signal. The clock generator of the plurality of clock generators may further include a mux configured to select between the global clocking signal and the related clocking signal. In an example, the clock generator of the plurality of clock generators may further include another mux configured to select the global clocking signal from a plurality of clocking signals. According to some examples, a signal controlling the mux to select between the global clocking signal and the related clocking signal is user selectable (programmable).

It is appreciated that in some examples the plurality of clock generators is positioned closer in proximity to the plurality of loads in comparison to the clock source. In some examples, a related clocking signal associated with one clock generator of the plurality of clock generators has a frequency that is different from a frequency of a related clocking signal associate with another clock generator of the plurality of clock generators.

According to one non-limiting example, each clock generator of the plurality of clock generators comprises a clock divider. The clock divider receives asynchronous global reset configured to reset the clock divider when global clocking signal is asserted low. The asynchronous global reset is deasserted after a number of cycles and the global clocking signal is synchronously asserted high subsequent to the asynchronous global reset being deasserted.

In one non-limiting example, another clock generator is configured to receive a related clocking signal or the global clocking signal from a clock generator of the plurality of clock generators. The another clock generator is further configured to generate another related clocking signal that is related to the received signal. The another clock generator is further configured to select between the received signal and the another related clocking signal and further configured to supply the selection to its respective load of the plurality of loads.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
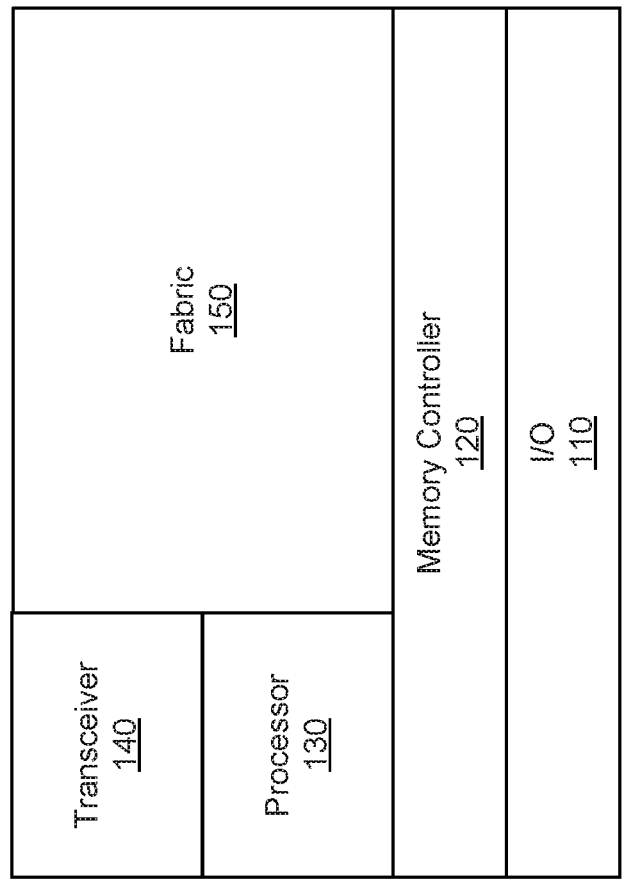
FIG. 1 shows a block diagram depicting a programmable device, according to some examples.

According to some aspects of the examples described herein, one clocking signal is fanned throughout. At the leaf nodes, usually much further away from the clock source, a related clocking signal is generated, where needed. In other words, a related clocking signal may be generated from a global clocking signal at a leaf node, thereby using less power because only one global clocking signal is fanned out to the entire chip rather than multiple clocking signals. Fanning out one global and generating related clocking signals at leaf nodes is further advantageous by reducing resource utilization such as metal utilization, thereby reducing cost. Generating related clocking signals at leaf nodes is further advantageous since the skew between the clocking signal and the related clocking signal is reduced because the generated related clock signal is subject to the same PVT variations as the one global clocking signal, at the leaf node. Also, since only one clocking signal is fanned out to the entire chip and the related clocking signal is generated at the leaf node, the jitter between the clocking signal and the related clocking signal being generated at the leaf node is substantially the same as one another.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

Some general concepts will first be described to clarify terms and nomenclature used throughout this description.

FIG. 1 shows a block diagram 100 depicting a programmable device, according to some examples. The block diagram 100 may be a programmable device such as an FPGA and may include input/output (I/O) 110 pins, memory controller 120, processor 130, transceiver 140, and fabric 150. It is appreciated that while the examples are described with respect to an FPGA the examples should not be construed as limited thereto. For example, the described examples are equally applicable to any electronic device, e.g., central processing unit (CPU), graphics pipeline unit (GPU), application specific integrated circuit (ASIC), etc., with some programmability. The I/O 110 pin may be used to communicate data between the device 110 and the outside environment. The memory controller 120 may be used to perform read/write to/from the memory component(s). The processor 130 is configured to process data and control the operation of the device 100. In some examples, the device 100 includes the transceiver 140 that is configured to send and receive data, e.g., wirelessly.

In the illustrated example, the fabric 150 is the programmable region of the device 100. FPGA architecture support many clock networks in spatially variable locations because the clock load locations are not pre-defined or known. Furthermore, the need to support many clock networks has increased because of an increase in number of designs that are operated at different portions of the same logical design at frequencies. In other words, the fabric 150 should facilitate the use of many clocks in parallel. However, as described above, fanning out multiple clocking signals results in skew due to PVT variations, increases power usage, and causes jitter. In order to improve skew, power consumption and jitters associated with fanning out multiple clocking signals, a clock divider may be used at every leaf node or a subset of the leaf nodes within the fabric 150. Using clock dividers at leaf nodes enables the single global clocking signal to be distributed throughout the chip, e.g., fabric 150, via the clock distribution network and for the global clocking signal to be used to generate a related clocking signal at the leaf node level, therefore generating multiple clocking frequencies locally at the leaf node. As such, skew and jitter are reduced while the amount of power consumption is also reduced. Moreover, fanning out one global and generating related clocking signals at leaf nodes reduces resource utilization such as metal utilization, thereby reducing cost. Routing of a single global clocking signal throughout the chip, e.g., fabric 150, and deriving multiple related clocking signals at the leaf nodes are described in further detail below.

Figure 2:
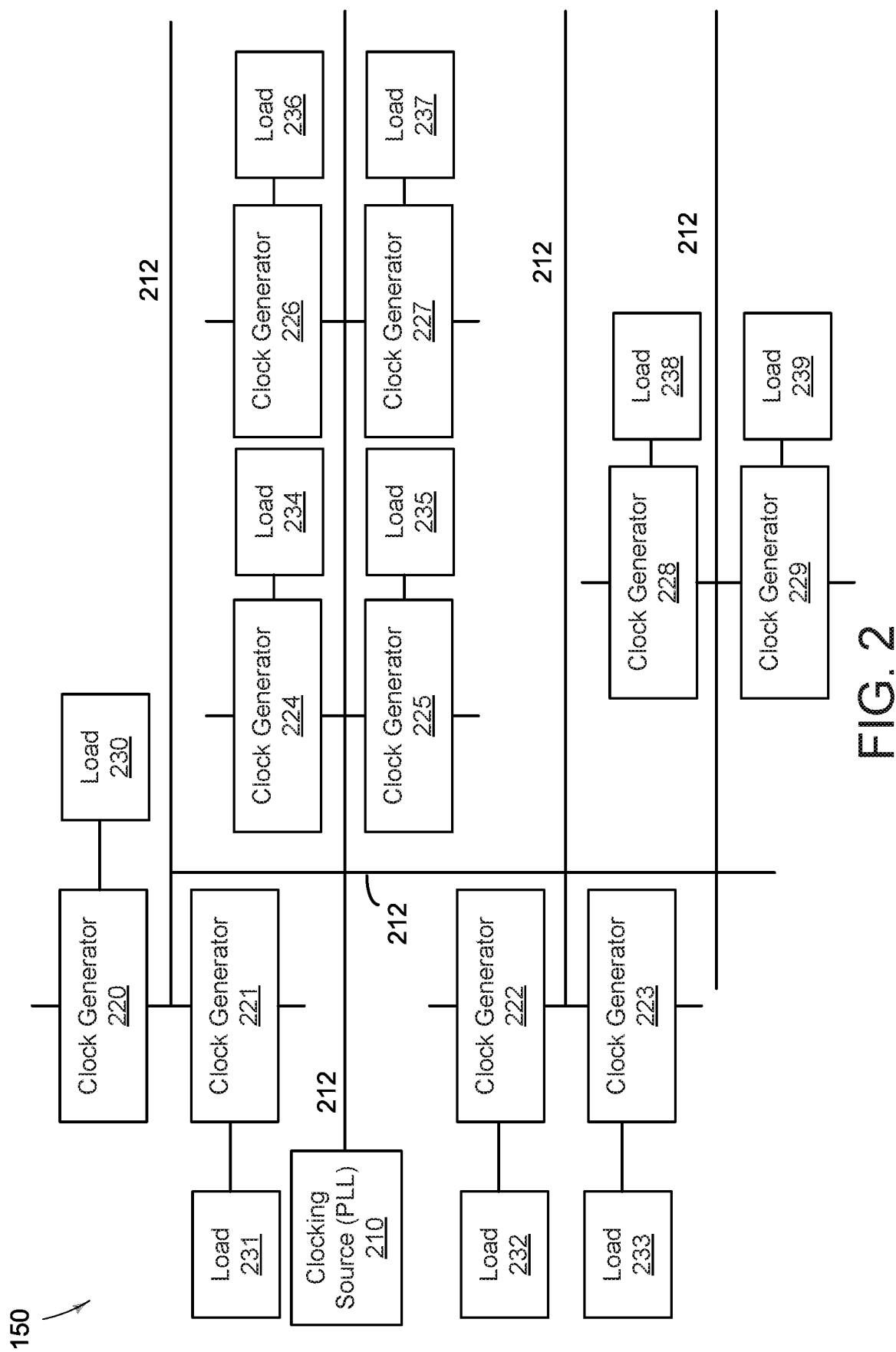
FIG. 2 shows a block diagram depicting a system for generating related clocks, according to some examples.

FIG. 2 shows a block diagram depicting a system for generating related clocks, according to some examples. The fabric 150 is shown including a clocking source 210, e.g., a phase locked loop (PLL), a delay locked loop (DLL) etc., configured to generate a single global clocking signal 212. The global clocking signal is distributed throughout the chip, e.g., fabric 150, via a clocking distribution network, to leaf nodes.

In the illustrated example, each leaf node may include a clock generator and a respective load(s). For example, a leaf node includes a clock generator 220 and load 230. In another example, another leaf node includes a clock generator 221 and a load 231. It is appreciated that in some examples, a leaf node may include a single clock generator with its associated loads, e.g., two or more loads. As such, description of a leaf node having a single clock generator and a single load is for illustration purposes and not intended to limit the scope of the examples.

In the illustrated examples, the fabric 150 includes clock generators 220-229 and loads 230-239. Each clock generator is configured to receive the global clocking signal from the clocking distribution network. The clock generator may then generate a related clocking signal to the global clocking signal, e.g., a clocking signal with a different frequency from the global clocking signal. It is appreciated that each clock generator may generate the same related clocking signal, e.g., same frequency, as other clock generators, or it may generate related clocking signals that have different frequencies from one another, or a combination thereof. It is appreciated that each clock generator may then select between the single global clocking signal and the related clocking signal. As such, the loads may be programmed to receive either the global clocking signal or the related clocking signal from its corresponding clock generator.

It is appreciated that the clock generators 220-229 are positioned physically closer in proximity to the loads 230-239 in comparison to the proximity of the clocking source 210 to the loads 230-239. In other words, the related clocking signal generated from the single global clocking signal by the clock generator is subject to substantially the same PVT, therefore having substantially the same skew as the global clocking signal. Moreover, since a single global clocking signal is fanned out throughout the chip, the amount of power consumption is reduced in comparison to fanning out more than one clocking signal.

Figure 3A:
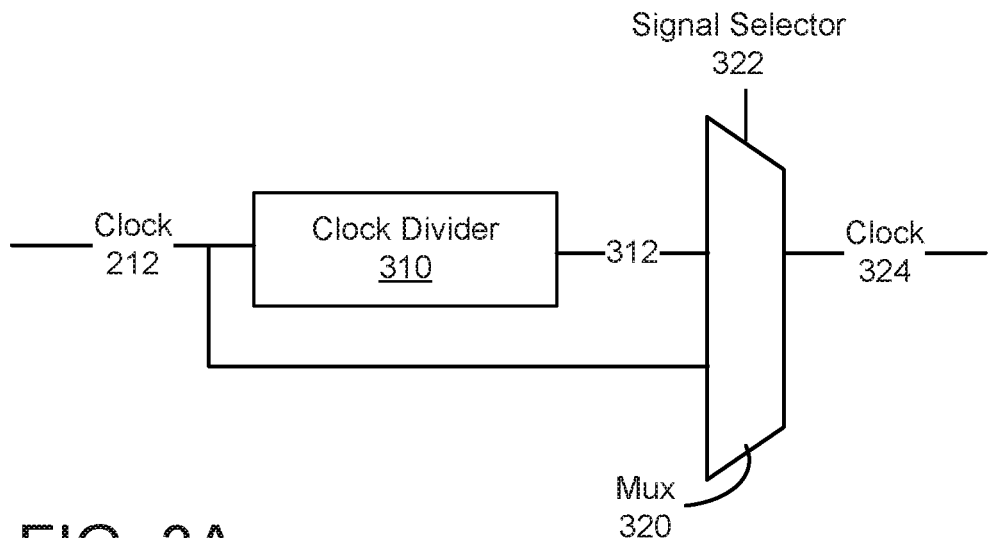
FIGS. 3A-3E show a block diagram depicting a clock generating circuitry, according to some examples.

FIGS. 3A-3E show a block diagram depicting a clock generating circuitry, according to some examples. Referring specifically to FIG. 3A, a clock generator according to some examples is shown. Clock generator includes a clock divider 310 and a mux 320. The clock divider 310 receives the single global clocking signal 212 and divides the frequency by an integer number, e.g., 2, 4, 8, etc., in order to generate a related clocking signal 312 to the global clocking signal 212. The mux 320 receives the global clocking signal 212 and the related clocking signal 312. Based on the design and application, the signal selector 322 may select between the global clocking signal 212 and the related clocking signal 312. The selected clocking signal 324 is then fanned out to the load(s) associated with the clock generator.

Figure 3B:
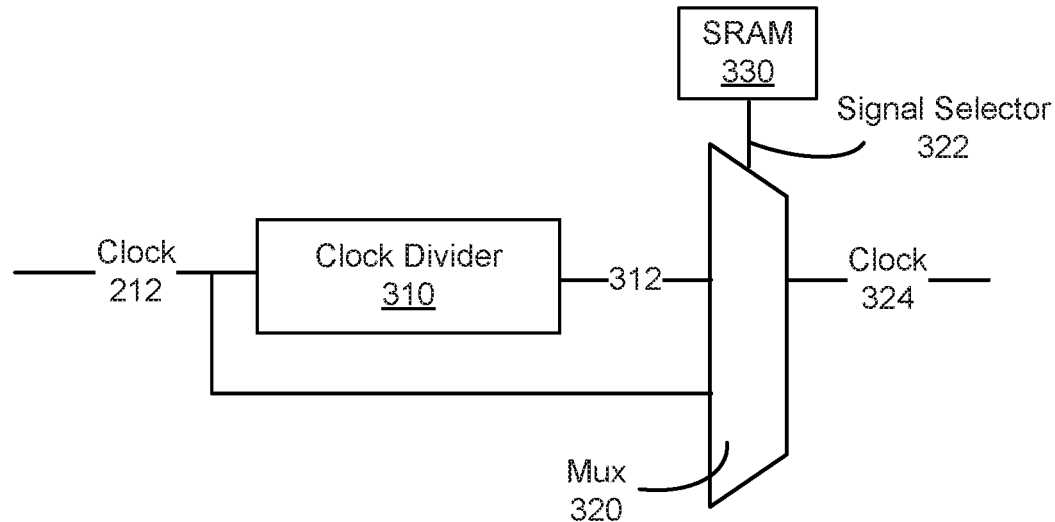

Referring now to FIG. 3B, a clock generator according to some examples is shown that is substantially similar to that in FIG. 3A. In this example, the signal selector 322 is received from a memory component, e.g., static random access memory (SRAM) 330. It is appreciated that the signal selector 322 may be user selectable, e.g., user programmable, based on the design. In some examples, the signal selector for some clock generators is hard coded while the signal selector for other clock generators may be user selectable and user programmable.

Figure 3C:
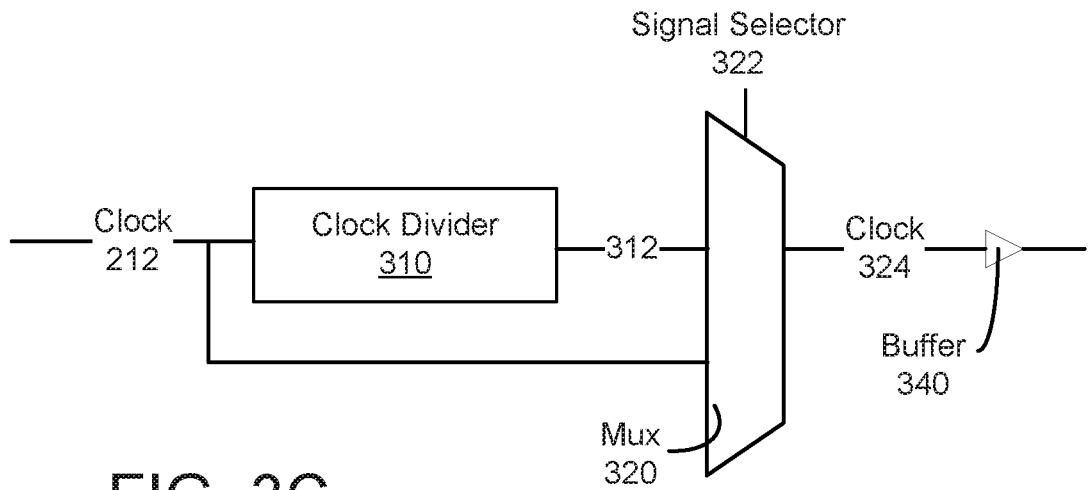

Referring now to FIG. 3C, a clock generator according to some examples is shown that is substantially similar to that in FIG. 3A. In this example, a buffer 349 is used at the output of the mux 320 to drive the selected clocking signal 324.

Figure 3D:
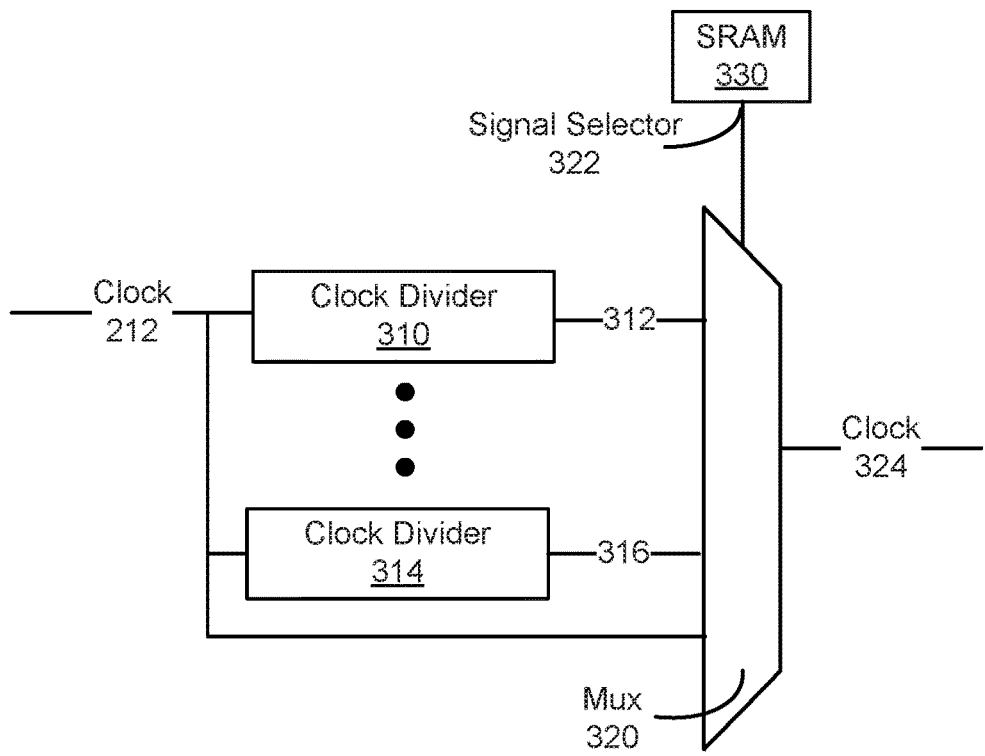

Referring now to FIG. 3D, a clock generator according to some examples is shown that is substantially similar to that in FIG. 3B. In this example, the clock generator includes a bank of clock dividers 310, . . . , clock divider 314. Each clock divider generates a related clocking signal. For example, clock divider 310 generates the related clocking signal 312 while clock divider 314 generates the related clocking signal 316. It is appreciated that the related clocking signal 312 has a frequency that is different from the related clocking signal 316. The mux 320 may select between the single global clocking signal 212 and the related clocking signals 312, . . . , 316. Thus, the selected clocking signal 324 may be fanned out to the respective load(s).

Figure 3E:
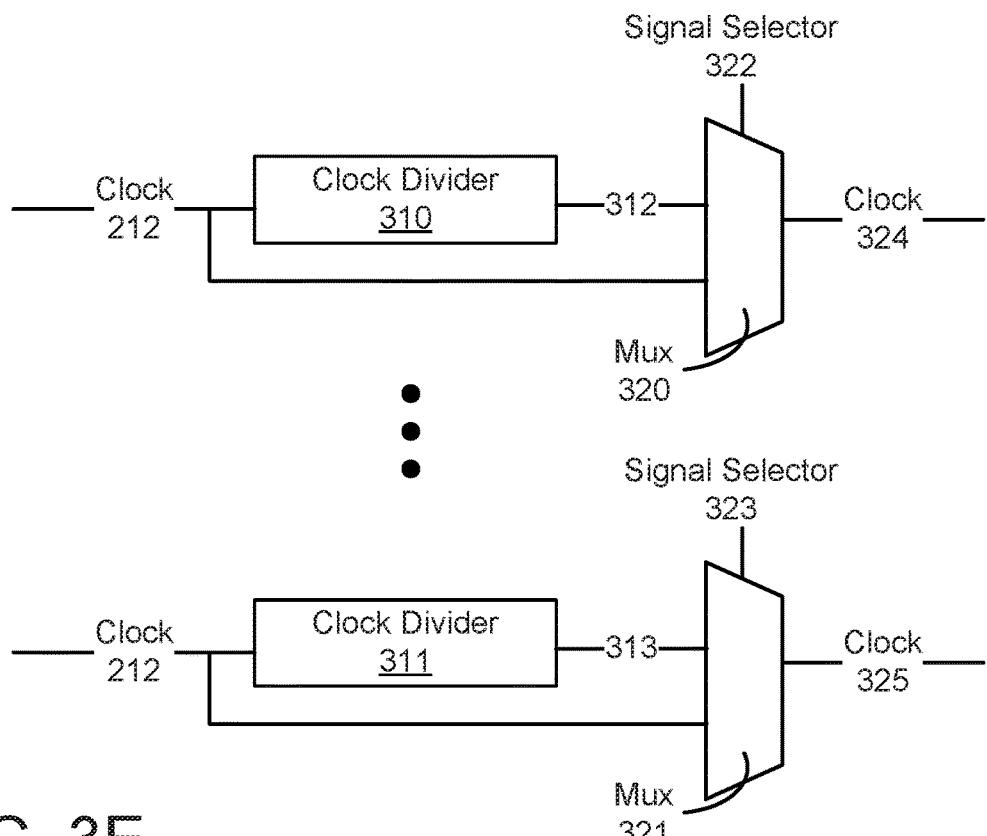

Referring now to FIG. 3E, a clock generator according to some examples is shown that is substantially similar to that in FIG. 3A. In this example, however, each leaf node has multiple clock generators where each clock generator generates a related clocking signal to the single global clocking signal 212. For example, a clock divider 311 generates a related clocking signal 313 that is fed into the mux 321, which in response to the signal selector 323 selects between the single global clocking signal 212 and the related clocking signal 313. The single global clocking signal as well as the related clocking signals 324, . . . , 325, at the leaf node are fed into a mux (not shown) such that a clock selection can be made similar to the clock selection via mux 320, as described above.

Figure 4:
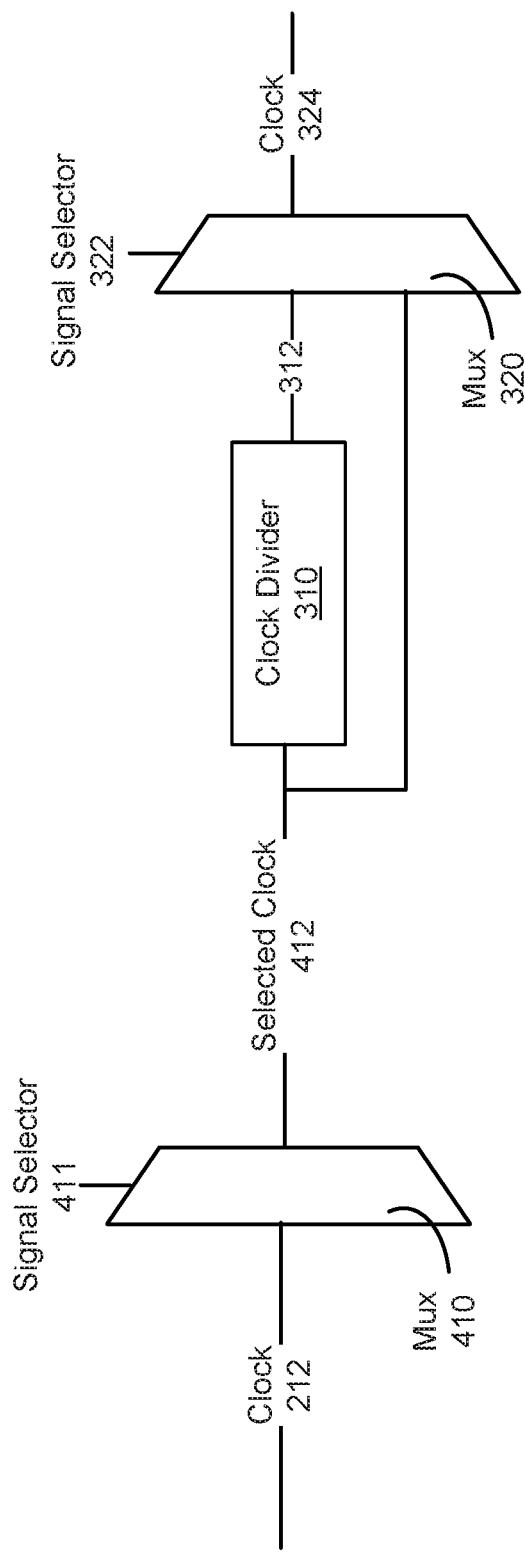
FIG. 4 shows a block diagram depicting another clock generating circuitry, according to some examples.

FIG. 4 shows a block diagram depicting another clock generating circuitry, according to some examples. In this example, the single global clocking signal 212 is received by a mux 410, at a leaf node. The global clocking signal 212 includes N clocks and the mux 410 selects a single clock from N possible clocks, based on the signal selector 411. The selected clock 412 is input to the clock divider 310. The operation of the clock divider 310 is described above. The mux 320 selects between the selected clock 412 and the related clock 312 based on the signal selector 322. Clock 324 is selected and supplied to its respective load(s).

Figure 5:
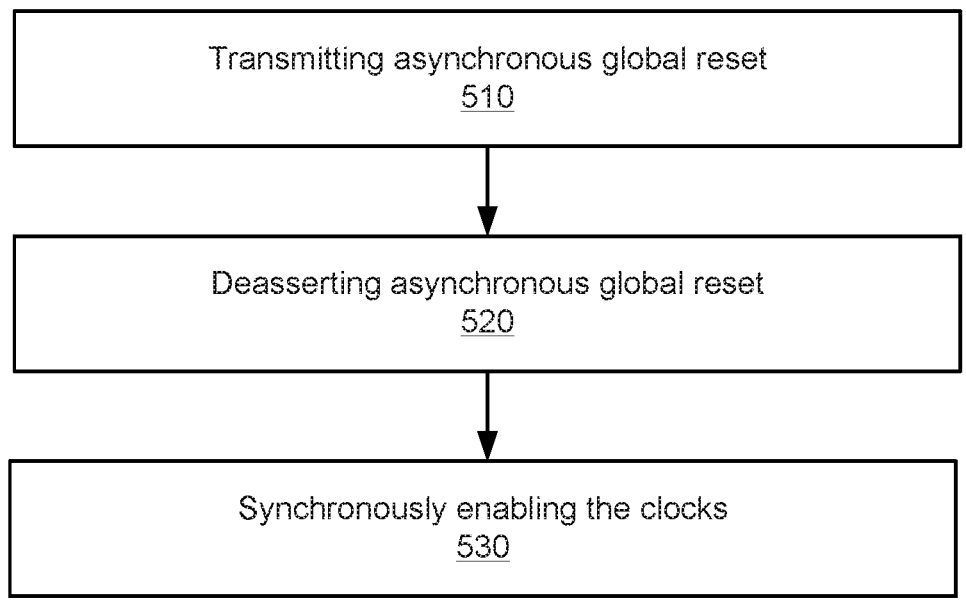
FIG. 5 shows a method flow for synchronizing leaf clock dividers, according to some examples.

FIG. 5 shows a method flow for synchronizing leaf clock dividers, according to some examples. It is appreciated that the leaf clock dividers should initially be synchronized otherwise the clock divider might toggle at different cycles relative to one another. At step 510, an asynchronous global reset signal is transmitted to all clock dividers at leaf nodes throughout the chip. After a number of cycles, e.g., long enough to ensure that all clock dividers have received the reset signal at step 520, asynchronous global reset is deasserted. At step 530, the clocks are synchronously enabled. Accordingly, all clock dividers are now synchronized and toggle at the same cycle with respect to one another.

Figure 6:
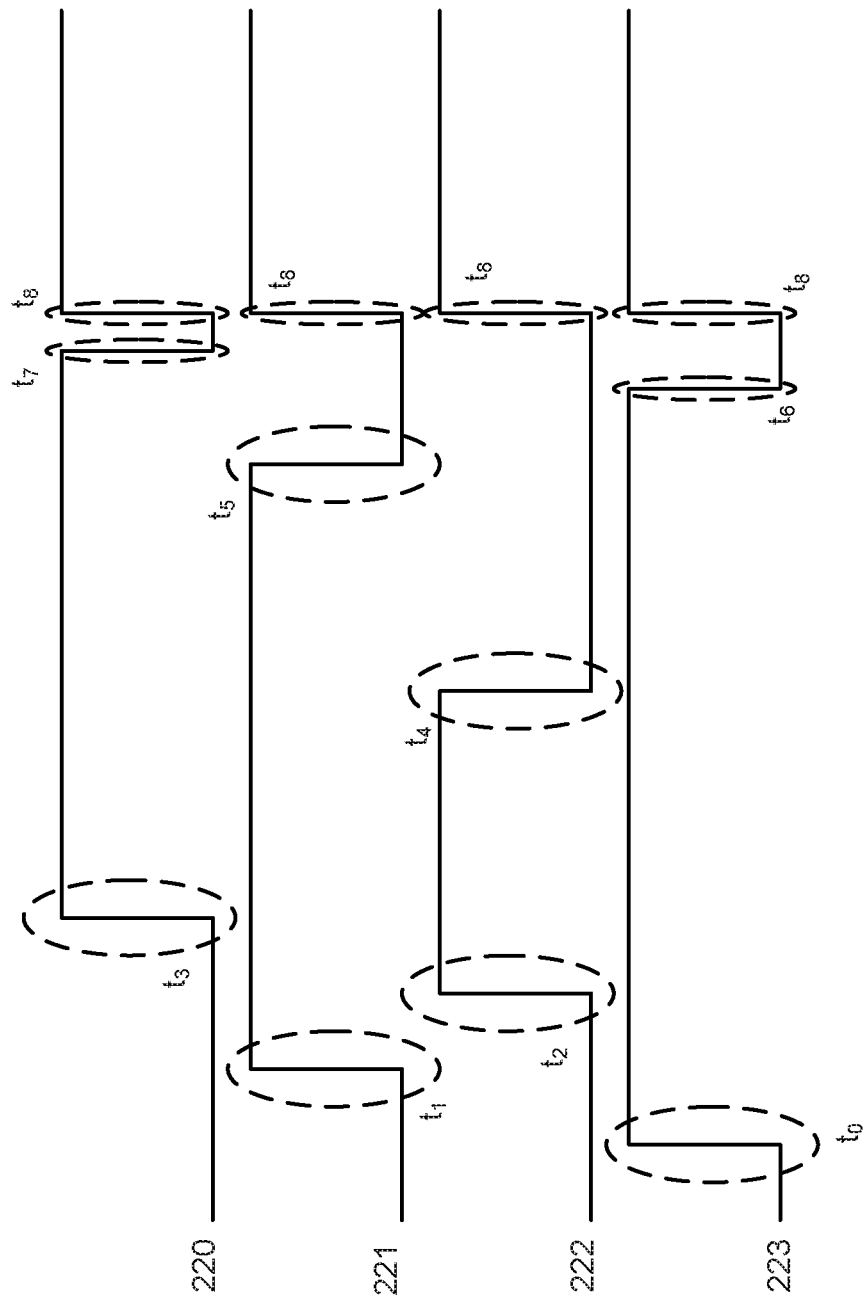
FIG. 6 shows an example of a timing diagram for synchronizing leaf clock dividers, according to some examples.

FIG. 6 shows an example of a timing diagram for synchronizing leaf clock dividers, according to some examples. In this example, the timing diagram with respect to only four clock generators, hence four clock dividers, is shown, but the number of clock dividers shown is for illustration purposes and should not be construed as limiting the scope of the examples. In this example, the clock divider 223 receives the asynchronous global reset signal at time $t_0$, while clock dividers 221, 222 and 220 receive the asynchronous global reset signal at time $t_1$, $t_2$, and $t_3$ respectively.

The asynchronous global reset is deasserted for clock generators 222, 221, 223 and 224 at time $t_4$, $t_5$, $t_6$, and $t_7$ respectively. The clocks are synchronously enabled for clock generators 220, 221, 222, and 223 at time $t_8$. Accordingly, the clock generators are synchronized and toggle at the same cycle with respect to one another.

Figure 7:
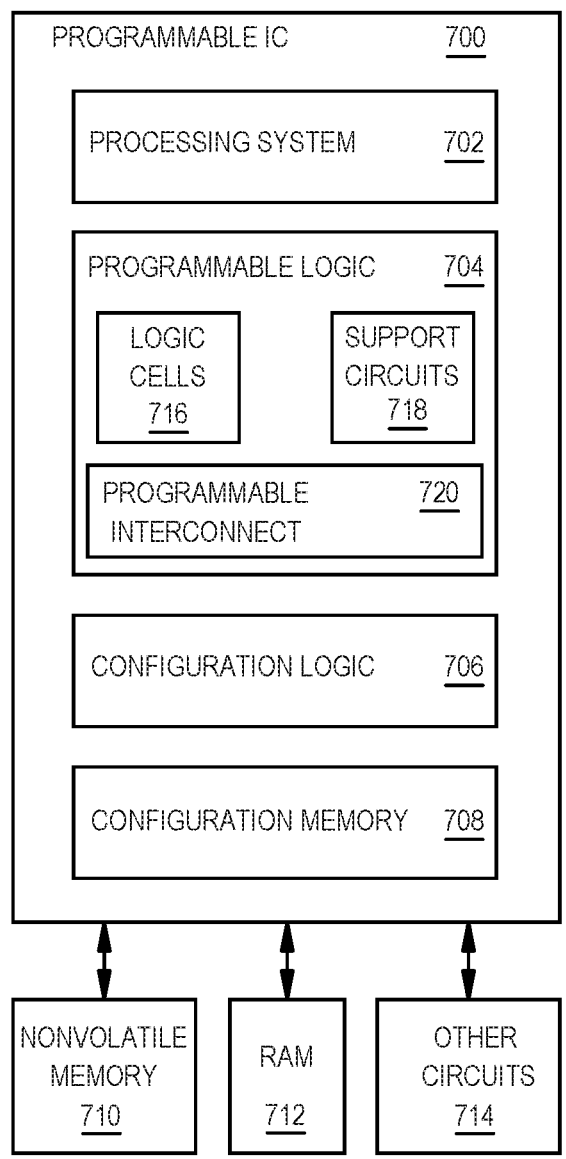
FIG. 7 is a block diagram depicting a programmable integrated circuit (IC), according to some examples.

FIG. 7 is a block diagram depicting a programmable integrated circuit (IC) 700 according to an example. The programmable IC 700 can implement the integrated circuit (IC) chip of systems of FIGS. 1-6, in whole or in part. The programmable IC 700 includes a processing system 702, programmable logic 704, configuration logic 706, and configuration memory 708. The programmable IC 700 can be coupled to external circuits, such as nonvolatile memory 710, RAM 712, and other circuits 714.

In the illustrated example, the processing system 702 can include microprocessor(s), memory, support circuits, IO circuits, and the like. The programmable logic 704 includes logic cells 716, support circuits 718, and programmable interconnect 720. The logic cells 716 include circuits that can be configured to implement general logic functions of a plurality of inputs. The support circuits 718 include dedicated circuits, such as transceivers, input/output blocks, digital signal processors, memories, and the like. The logic cells and the support circuits 718 can be interconnected using the programmable interconnect 720. Information for programming the logic cells 716, for setting parameters of the support circuits 718, and for programming the programmable interconnect 720 is stored in the configuration memory 708 by the configuration logic 706. The configuration logic 706 can obtain the configuration data from the nonvolatile memory 710 or any other source (e.g., the RAM 712 or from the other circuits 714).

Figure 8:
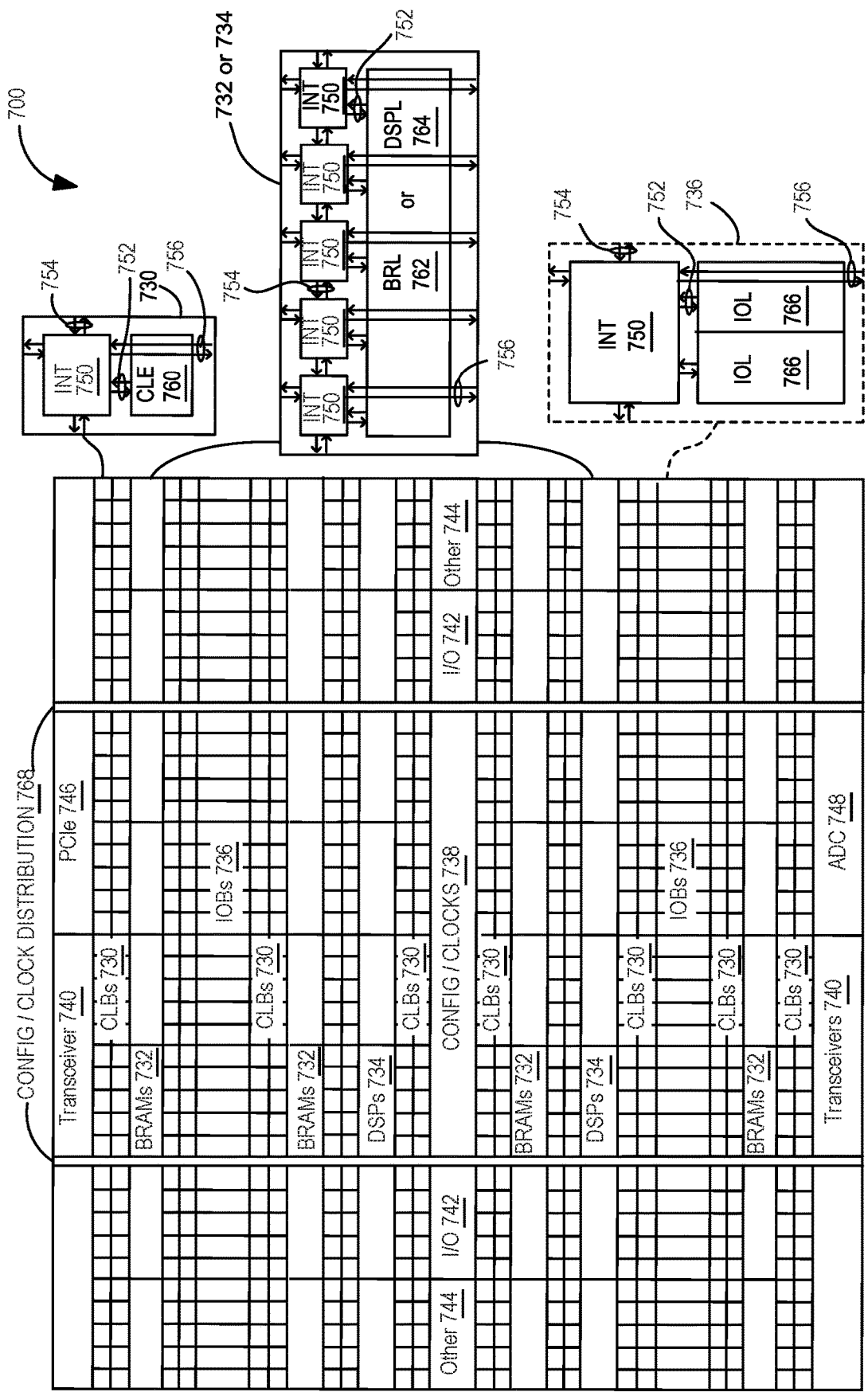
FIG. 8 is a field programmable gate array (FPGA) implementation of the programmable IC, according to some examples.

FIG. 8 illustrates an FPGA implementation of the programmable IC 700 that includes a large number of different programmable tiles including configurable logic blocks ("CLBs") 730, random access memory blocks ("BRAMs") 732, signal processing blocks ("DSPs") 734, input/output blocks ("IOBs") 736, configuration and clocking logic ("CONFIG/CLOCKS") 738, digital transceivers 740, specialized input/output blocks ("I/O") 742 (e.g., configuration ports and clock ports), and other programmable logic 744 such as digital clock managers, system monitoring logic, and so forth. The FPGA can also include PCIe interfaces 746, analog-to-digital converters (ADC) 748, and the like.

In some examples, each programmable tile in an FPGA can include at least one programmable interconnect element ("INT") 750 having connections to input and output terminals 752 of a programmable logic element within the same tile, as shown by examples included in FIG. 7. Each programmable interconnect element 750 can also include connections to interconnect segments 754 of adjacent programmable interconnect element(s) in the same tile or other tile(s). Each programmable interconnect element 750 can also include connections to interconnect segments 756 of general routing resources between logic blocks (not shown). The general routing resources can include routing channels between logic blocks (not shown) comprising tracks of interconnect segments (e.g., interconnect segments 756) and switch blocks (not shown) for connecting interconnect segments. The interconnect segments of the general routing resources (e.g., interconnect segments 756) can span one or more logic blocks. The programmable interconnect elements 750 taken together with the general routing resources implement a programmable interconnect structure ("programmable interconnect") for the illustrated FPGA.

In an example of implementation, a CLB 730 can include a configurable logic element ("CLE") 760 that can be programmed to implement user logic plus a single programmable interconnect element ("INT") 750. A BRAM 732 can include a BRAM logic element ("BRL") 762 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 734 can include a DSP logic element ("DSPL") 764 in addition to an appropriate number of programmable interconnect elements. An 10B 736 can include, for example, two instances of an input/output logic element ("IOL") 766 in addition to one instance of the programmable interconnect element 750. As will be clear to those of skill in the art, the actual I/O pads connected, for example, to the input/output logic element 766 typically are not confined to the area of the input/output logic element 766.

In the pictured example, a horizontal area near the center of the die is used for configuration, clock, and other control logic. Vertical columns 768 extending from this horizontal area or column are used to distribute the clocks and configuration signals across the breadth of the FPGA.

In some examples, FPGAs utilizing the architecture illustrated in FIG. 7 include additional logic blocks that disrupt the regular columnar structure making up a large part of the FPGA. The additional logic blocks can be programmable blocks and/or dedicated logic. Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A system comprising:
   a clock source configured to generate a global clocking signal;
   a plurality of loads;

a clock distribution network configured to fan out the global clocking signal to the plurality of loads; and a plurality of clock generators configured to receive the global clocking signal through the clock distribution network, wherein each clock generator of the plurality of clock generators is configured to:
  generate a related clocking signal from the received global clocking signal;
  generate a clocking signal by selecting the global clocking signal or the related clocking signal; and
  supply the clocking signal to a respective load of the plurality of loads, and wherein each clock generator of the plurality of clock generators is positioned closer in proximity to the respective load of the plurality of loads in comparison to the clock source.

2. The system of claim 1, wherein the clock source is a phase locked loop (PLL).

3. The system of claim 1, wherein the clock distribution network, the plurality of clock generators, and the plurality of loads are positioned within a programmable region of a field programmable gate array (FPGA).

4. The system of claim 1, wherein each clock generator of the plurality of clock generators comprises a clock divider configured to change a frequency of the global clocking signal to generate the related clocking signal and wherein the clock generator of the plurality of clock generators further comprises a first multiplexer configured to select between the global clocking signal and the related clocking signal.

5. The system of claim 4, wherein each clock generator of the plurality of clock generators further comprises a second multiplexer configured to select the global clocking signal from a plurality of clocking signals.

6. The system of claim 4, wherein a signal controlling the first multiplexer configured to select between the global clocking signal and the related clocking signal is programmable.

7. The system of claim 1, wherein the related clocking signal associated with a first one of the plurality of clock generators has a frequency that is different from a frequency of the related clocking signal associated with a second one of the plurality of clock generators.

8. The system of claim 1, wherein each clock generator of the plurality of clock generators comprises a clock divider, and wherein each clock divider receives asynchronous global reset configured to reset the each clock divider when global clocking signal is asserted low, and wherein the asynchronous global reset is deasserted after a number of cycles, and wherein the global clocking signal is synchronously asserted high subsequent to the asynchronous global reset being deasserted.

9. The system of claim 1, wherein a number of loads in the plurality of loads is greater than a number of clock generators of the plurality of clock generators.

10. The system of claim 1, further comprising a first clock generator of the plurality of clock generators and a second clock generator, wherein the first clock generator is configured to supply the clocking signal to the second clock generator and wherein the second clock generator is configured to:
  generate a second related clocking signal from the received clocking signal;
  generate a second clocking signal by selecting the clocking signal or the second related clocking signal; and
  supply the second clocking signal to a respective load of the plurality of loads.

11. A system comprising:
  a clock source configured to generate a global clocking signal;
  a plurality of loads;
  a clock distribution network configured to fan out the global clocking signal to the plurality of loads; and
  a plurality of clock generators configured to receive the global clocking signal through the clock distribution network, wherein each clock generator of the plurality of clock generators is further configured to:
    generate a related clocking signal from the received global clocking signal;
    generate a clocking signal by selecting the global clocking signal or the related clocking signal; and
    supply the clocking signal to a respective load of the plurality of loads.

12. The system of claim 11, wherein the clock source is a phase locked loop (PLL).

13. The system of claim 11, wherein the clock distribution network and the plurality of clock generators are positioned within a programmable region of a field programmable gate array (FPGA).

14. The system of claim 11, wherein a clock generator of the plurality of clock generators comprises a clock divider configured to change a frequency of the global clocking signal to generate the related clocking signal and wherein each clock generator of the plurality of clock generators further comprises a first multiplexer configured to select between the global clocking signal and the related clocking signal.

15. The system of claim 14, wherein each clock generator of the plurality of clock generators further comprises a second multiplexer configured to select the global clocking signal from a plurality of clocking signals.

16. The system of claim 14, wherein a signal controlling the first multiplexer configured to select between the global clocking signal and the related clocking signal is programmable.

17. The system of claim 11, wherein each of the plurality of clock generators is positioned closer in proximity to the respective load of the plurality of loads in comparison to the clock source.

18. The system of claim 11, wherein the related clocking signal associated with a first clock generator of the plurality of clock generators has a frequency that is different from a frequency of the related clocking signal associated with a second clock generator of the plurality of clock generators.

19. The system of claim 11, wherein the each clock generator of the plurality of clock generators comprises a clock divider, and wherein each clock divider receives asynchronous global reset configured to reset the each clock divider when global clocking signal is asserted low, and wherein the asynchronous global reset is deasserted after a number of cycles, and wherein the global clocking signal is synchronously asserted high subsequent to the asynchronous global reset being deasserted.

20. The system of claim 11, further comprising a first clock generator of the plurality of clock generators and a second clock generator, wherein the first clock generator is configured to supply the clocking signal to the second clock generator and wherein the second clock generator is configured to:
  generate a second related clocking signal from the received clocking signal;
  generate a second clocking signal by selecting the clocking signal or the second related clocking signal; and supply the second clocking signal to a respective load of the plurality of loads.

* * * * *